United States Patent [19]
Burnham et al.

[11] Patent Number: 4,461,007
[45] Date of Patent: Jul. 17, 1984

[54] INJECTION LASERS WITH SHORT ACTIVE REGIONS

[75] Inventors: Robert D. Burnham; William Streifer, both of Palo Alto; Donald R. Scifres, Los Altos, all of Calif.

[73] Assignee: Xerox Corporation, Stamford, Conn.

[21] Appl. No.: 338,455

[22] Filed: Jan. 8, 1982

[51] Int. Cl.³ .............................................. H01S 3/19
[52] U.S. Cl. ..................................... 372/45; 357/17; 372/46; 372/50
[58] Field of Search ...................... 372/50, 44, 45, 46; 357/17; 350/96.11, 96.12

[56] References Cited

U.S. PATENT DOCUMENTS

| 3,790,902 | 2/1974 | Miller | 372/49 |
| 4,121,177 | 10/1978 | Tsukada | 372/46 |
| 4,176,325 | 11/1979 | Kajimura et al. | 372/46 |
| 4,190,813 | 2/1980 | Logan et al. | 372/46 |
| 4,309,667 | 1/1982 | Di Forte et al. | 372/50 |

FOREIGN PATENT DOCUMENTS 1539028 1/1979 United Kingdom .

OTHER PUBLICATIONS

H. Yonezu et al., "High Optical Power Density . . . Double-Heterostructure Laser", APL, vol. 34 (10), pp. 637-639, 5/15/79.
R. L. Hartman et al., "The CW Electro-Optical Properties . . . Heterostructure Lasers", J. Appl. Phys., vol. 51 (4), pp. 1909-1918, 4/80.
Butler et al., "Asymmetric Modes in Oxide Stripe Heterojunction Lasers", IEEE Quantum Electronics, vol. QE-14 (6), pp. 413-417, 6/78.
W. F. Tsang et al., "GaAs-Al$_x$Ga$_{1-x}$ As Buried Heterostructure . . . ", APL, vol. 36, No. 9, pp. 730-735, May 1980.
H. O. Yonezu et al., "An AlGaAs Window Structure Laser", IEEE JQE, vol. QE-15/8, pp. 775-781, 8/79.
Xerox Disclosure Journal, vol. 4/5, p. 637, (Sep./Oct. 1979).

Primary Examiner—James W. Davie
Attorney, Agent, or Firm—W. Douglas Carothers, Jr.

[57] ABSTRACT

An injection laser includes a plurality of contiguous semiconductor layers deposited on a substrate, one of the layers being an active layer and having a lower bandgap and higher index of refraction relative to at least cladding layers immediately adjacent to the active layer. The active layer is provided with an active region to permit carrier recombination and support radiation propagating under lasing conditions in a optical waveguide cavity established between transverse end facets of the laser. Means is incorporated on and into the surface of the laser to form a current confinement region to the active region. The extremities of the active region fall short of the end facets so that the regions of the active layer between the active region function as a passive waveguide for the propagating radiation in the optical cavity. The laser is characterized in that the active region is an active region strip having a length less than the total length of both of the passive waveguide regions formed at the ends of the active region strip. More than one laser cavity may be formed on the same substrate so that several active regions are formed with separate current confinement regions forming a laser array device. Means are formed on the surface of the device to render the surface thereof electrically insulating except for the separate current confinement regions. Electrical contact means are formed on this insulating surface means to independently supply current to each of the current confinement regions without interfering with the electrical and optical operation of other array lasers. The employment of short active regions and consequentially the presence of the separate current confinement regions on the insulating surface of the laser array device permits the optical cavities of adjacent laser cavities in the array to be fabricated spatially closer to one another than previously possible while permitting independent electrical addressing of each the laser active regions without interfering with the operation of other array lasers. The active regions of adjacent array lasers may be offset relative to each other so that the packing density of lasers in the array is increased.

14 Claims, 24 Drawing Figures

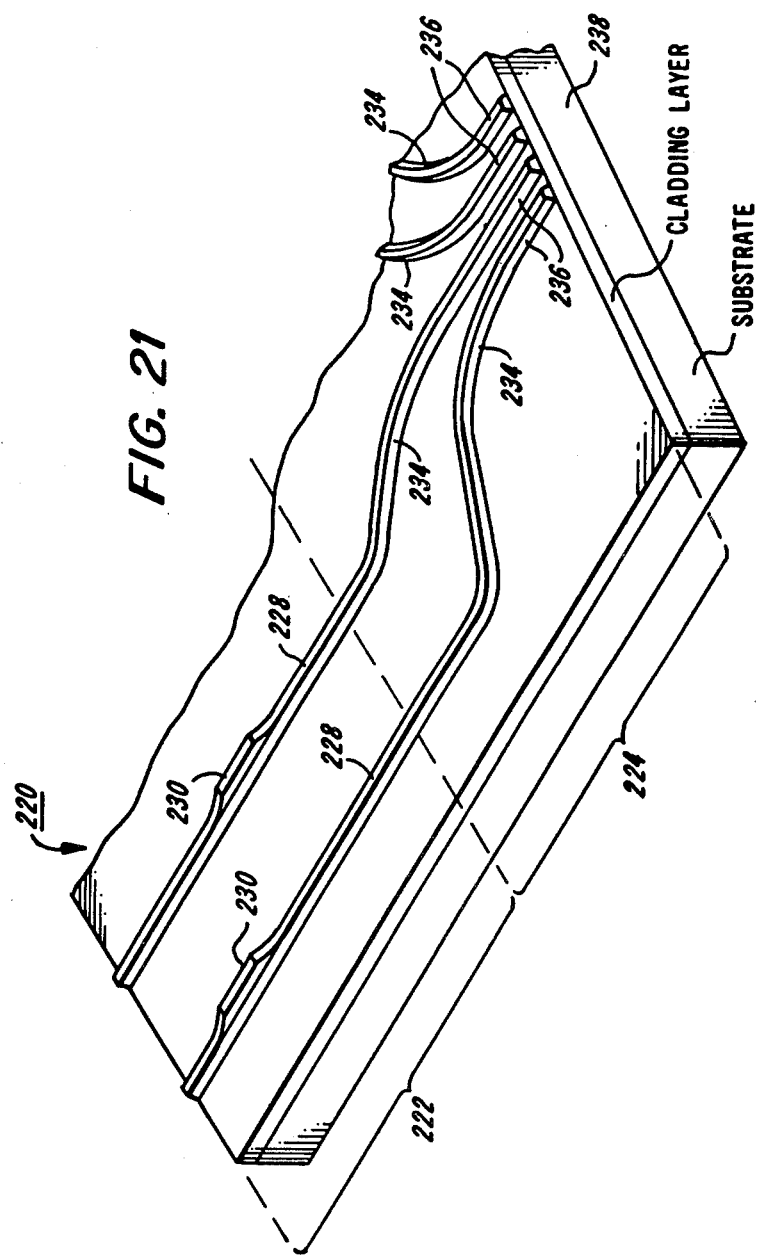

INJECTION LASERS WITH SHORT ACTIVE REGIONS

BACKGROUND OF THE INVENTION

This invention relates to semiconductor injection lasers.

Since the introduction of the heterostructure laser, this laser structure has come into much prominence with many geometric variations.

One of the most important variations has been the buried heterostructure laser wherein the active layer or region is partially or completely surrounded with material of higher bandgap and lower index of refraction.

Over the last several years, much attention has been directed to fundamental transverse mode control and low beam divergence in buried heterostructure lasers. An early idea was to provide the end of an injection laser with a transparent unpumped region having a passive waveguide core coupled to the active layer, as disclosed in U.S. Pat. No. 3,790,902.

More recently, the suggestion has been to provide an active region or strip such as, GaAs, completely surrounded by a higher index of refraction material, such as, GaAlAs. Examples of such heterostructures are found in U.S. Pat. Nos. 4,121,177 4,176,325 and 4,190,813 and in the paper of W.F. Tsang et al entitled, "GaAs-Al$_x$Ga$_{1-x}$As Buried Heterostructure Lasers Grown by Molecular Beam Epitaxy . . . " Applied Physics Letters, Vol. 36, No. 9, pp 730–735, May 1, 1980 and have been referred to as strip buried heterostructure lasers because the active layer geometry is in the form of a three dimensional strip and waveguide. Such a strip is desirable because of its preferred mode selection and optical guiding capability.

Even more recently, the suggestion has been made to provide an optically transparent unpumped region at the end mirror facets to reduce mirror degradation. This concept is disclosed in the paper of H. O. Yonezu et al entitled "An AlGaAs Window Structure Laser", IEEE Journal of Quantum Electronics, Vol. QE-15, No. 8, pp 775–781, August, 1979 and in the Xerox Disclosure Journal, Vol. 4, No. 5, p 637 (September/October, 1979). This concept has been suggested for integration into the strip buried heterostructure laser [R. L. Hartman et al, "The CW Electro-Optical Properties of (Al,Ga)As Modified-Strip Buried Heterostructure Lasers", Journal of Applied Physics, Vol. 51, No. 4, pp 1909–1918, April 1980].

The most important advantage of these transparent window structure lasers is that since the active region of the laser is not equal to the total length of the laser optical cavity, i.e., the distance between the end mirror facets, the life of these types of lasers is increased since mirror degradation is reduced or practically eliminated. However, other physical restraints are still present, such as, higher current threshold and the inability to provide an integrated laser chip with a plurality of laser emitters which are closely spaced and independently addressable and operable at low currents and with acceptable heat sinking practicality.

SUMMARY OF THE INVENTION

According to this invention, an injection laser is characterized by having very short active regions in the form of an active region strip. The active region strip may be integral with a transparent passive waveguide layer capable of confining propagating radiation in the optical cavity of the laser in at least one dimension transverse to the direction of propagation or may be integral with a transparent passive waveguide strip capable of confining propagating radiation in both dimensions transverse to the direction of propagation.

The length of the active region strip may be for example, in the range of 5 to 200 times shorter than the length of the optical cavity of the laser. The injection laser comprising this invention includes a plurality of contiguous semiconductor layers deposited on a substrate, one of the layers being an active layer and having a lower bandgap and higher index of refraction relative to at least cladding layers immediately adjacent to the active layer. The active layer is provided with an active region to permit carrier recombination and support radiation propagating under lasing conditions in a optical waveguide cavity established between transverse end facets of the laser. Means is incorporated on and into the surface of the laser to form a current confinement region to the active region. The extremities of the active region fall short of the end facets so that the regions of the active layer between the active region function as a passive waveguide for the propagating radiation in the optical cavity. The laser is characterized in that the active region is an active region strip having a length less than the total length of both of the passive waveguide regions formed at the ends of the active region strip.

More than one laser cavity may be formed on the same substrate so that several active regions are formed with separate current confinement regions forming a laser array device. Means are formed on the surface of the device to render the surface thereof electrically insulating except for the separate current confinement regions. Electrical contact means are formed on this insulating surface means to independently supply current to each of the current confinement regions without interfering with the electrical and optical operation of other array lasers. The employment of short active regions and consequentially the presence of the separate current confinement regions on the insulating surface of the laser array device permits the optical cavities of adjacent laser cavities in the array to be fabricated spatially closer to one another than previously possible while permitting independent electrical addressing of each the laser active regions without interfering with the operation of other array lasers. The active regions of adjacent array lasers may be offset relative to each other so that the packing density of lasers in the array is increased.

The advantages of employing such short active regions is that (1) the current threshold to bring about lasing is reduced, (2) heat sinking of one or more lasers per chip becomes practical for CW operation, and (3) it becomes possible to independently, electrically contact several injections lasers having closely spaced lasing cavities on a single substrate.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 16 illustrates rectangular bonding pads for each short active region and positioned over the entire chip surface;

FIG. 17 illustrates, row aligned bonding pads along one side of the chip with pad extensions to short active regions aligned along the other side of the chip;

FIG. 18 illustrates, row aligned bonding pads along opposite sides of the chip with pad extensions to short active regions aligned centrally of the laser chip;

FIG. 19 illustrates, row aligned bonding pads parallel and adjacent to the optical laser cavities along opposite edges of the chip with pad extensions to short active regions aligned centrally of the laser chip;

FIG. 21 is a perspective view of a portion of the array shown in FIG. 20, the view being taken from the plane of the short active regions of the laser array;

DETAILED DESCRIPTION OF THE PREFERRED EMBODIMENTS

Figure 1:
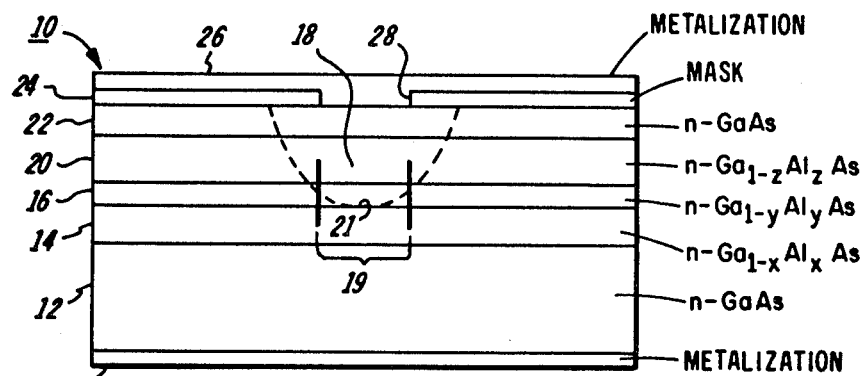
FIG. 1 is a side elevation of a heterostructure injection laser in accordance with one embodiment of the present invention.

The structure of the heterostructure injection lasers and laser arrays to be described are characterized by having very short active regions, i.e., the active regions where actual carrier and radiative recombination occurs is very small compared to the extent of the radiation propagating cavity of the device. The length of these regions may be in the range of 5 to 200 times shorter than the cavity length.

For practical cleaving purposes, laser cavity lengths are typically 250 $\mu$m long. It is possible to cleave shorter cavities but cleaving and handling of the laser chip becomes considerably more difficult. By providing transparent waveguides on either or both ends of the active region forming the optical cavity, the active region may be made considerably shorter than the active region lengths now found in conventional semiconductor injection lasers.

In the case of active regions having two dimensional character, i.e., radiation confinement in at least one direction transverse to the optical propagating cavity, active regions as short as 10 $\mu$m are possible. In the case of active regions having three dimensional character, i.e., radiation confinement in both directions transverse to the optical propagating cavity, active regions as short as 1 $\mu$m are possible.

The employment of very short active regions reduces the current requirements for lasing. The established current density in the active region will be increased and the gain will be much increased. It is difficult to determine the dependence of gain on current density but an approximate of the relationship is $$g = AJ$$

where g is the gain, A is constant and J is the current density.

If optical coupling between the active region into the passive waveguide regions is efficient, e.g., about 100%, a heterostructure injection laser with a 50 $\mu$m short active region with an optical cavity length of 250 $\mu$m lases with a total current that is approximately half that of a conventional heterostructure injection laser with the same optical cavity length of 250 $\mu$m and with an active region of equal length, i.e., 250 $\mu$m long. Such a laser with a very short active region will have a current threshold around 5 or 6 mA while the best conventional laser would be about 10 or 12 mA or more. With lower current thresholds and operating currents, the realization of practical laser arrays is possible with sufficient and practical heat sinking. With short active regions, it is possible to pump each laser in a laser array independently of one another at lower operating currents.

It is within the contemplation of this invention that active regions may, for example, be 21 to 50 $\mu$m long and 1 to 10 $\mu$m wide for a 250 $\mu$m optical cavity length. For a given width of the active region, lowest order transverse mode operation can be obtained in the plane of the semiconductor layers by adjusting the distance between facet ends and the ends of the active region. This is because the coupling of the reflected higher order transverse modes back into the active region of the laser cavity is reduced due to the presence of a long transparent waveguide section. This reduction is greater for the higher order transverse modes as compared to the lowest order transverse mode, leading to a larger threshold current increase for the higher order transverse modes compared to the fundamental transverse mode.

The laser structures to be discussed may be fabricated using liquid phase epitaxy (LPE), molecular beam epitaxy (MBE) or metalorganic chemical vapor deposition (MO-CVD). A combination of these epitaxial processes may be employed to fabricate laser structures having a three dimensional character as discussed in U.S. Pat. No. 4,371,966.

All of the laser structures to be discussed have cleaved end facets to provide optical feedback as conventionally known in the art. However, other types of feedback that are known in the art may obviously be employed in the design of these laser structures.

Figure 2:
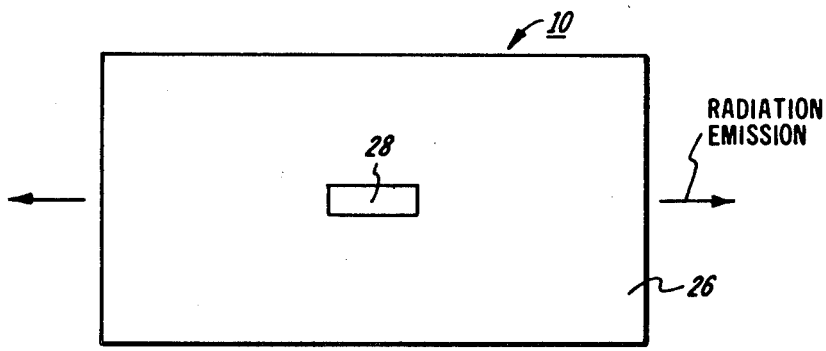
FIG. 2 is a plan view of the laser shown in FIG. 1.
Figure 3:
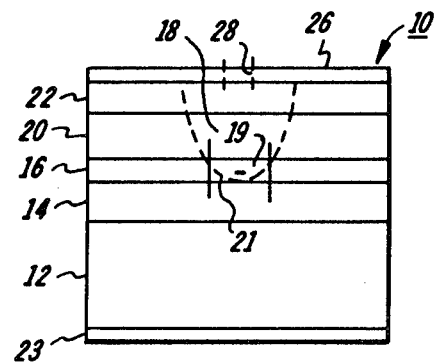
FIG. 3 is an end view of the laser shown in FIG. 1.

In FIGS. 1–3, the heterostructure injection laser 10 comprises a plurality of consecutively deposited semiconductor layers, for example, of GaAs and GaAlAs of varying doping levels, thicknesses and composition. Substrate 12 may be n-GaAs. Layers 14–22 may respectively comprise cladding layer of n-Ga$_{1-x}$Al$_x$As, active layer of n-Ga$_{1-y}$Al$_y$As, cladding layer of n-Ga$_{1-z}$Al$_z$As and contact layer n-GaAs where x, z>y. Examples of molar fractions are x and z equal to 0.3 and y equal to 0.05. The two dimensional character active layer 16 may also comprise GaAs.

Layer 24 is a diffusion mask, such as, Si$_3$N$_4$, Al$_2$O$_3$ or SiO$_2$. With a conventional selective etch, a rectangular opening 28 is produced in the mask layer 24. This is followed by a p-type diffusion (Zn diffusion) performed through opening 28 forming the p-type diffusion region 18 illustrated in FIGS. 1 and 3. Region 18 is selected to extend into active layer 16, the highest index layer relative to layers 14 and 20, to form an active region 19 with a p-n junction 21 disposed in that region.

Mask 24 is of electrically insulating material. A metallic contact or metalization layer 26 is then deposited on mask layer 24 and in opening 28 to conventionally function as an electrode.

Figure 4:
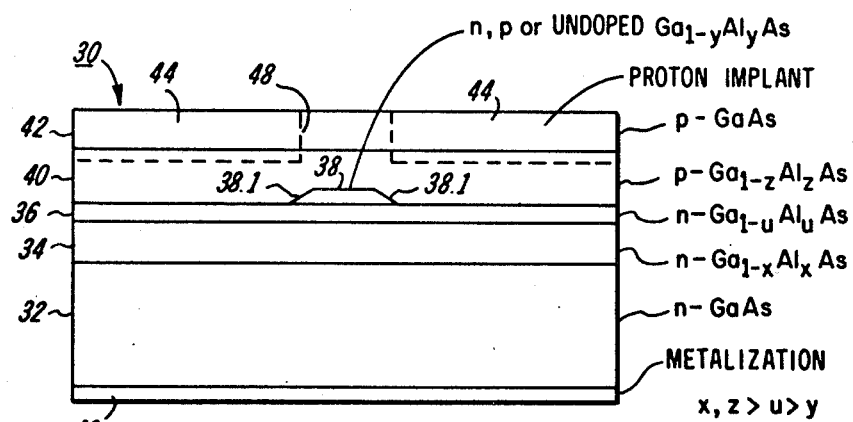
FIG. 4 is a side elevation of a heterostructure injection laser in accordance with another embodiment of the present invention.
Figure 5:
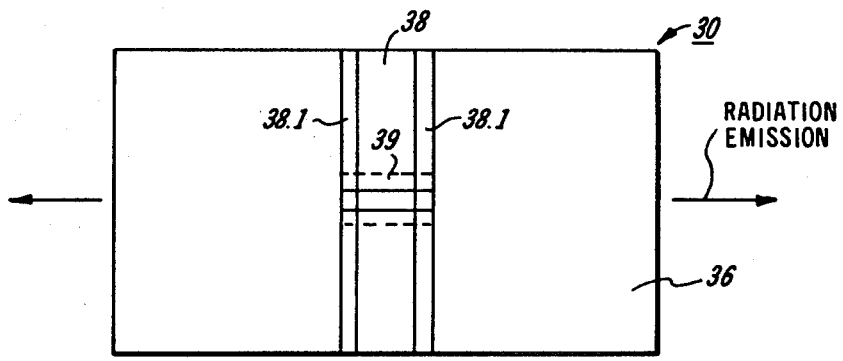
FIG. 5 is a top sectional view of the laser shown in FIG. 4, the section being taken at the plane of the active region of the laser.
Figure 6:
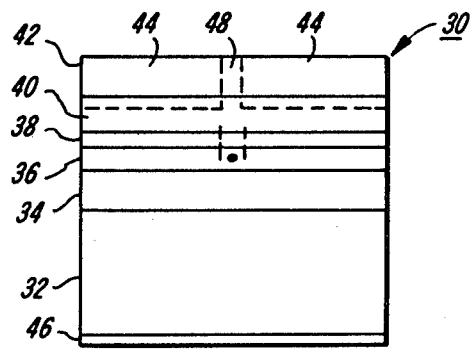
FIG. 6 is an end view of the laser shown in FIG. 4.

Injection laser 30 of FIGS. 4–6 comprises substrate 32 of n-GaAs and claddering, passive waveguide, active, claddering and contact layers 34–42, respectively, n-Ga$_{1-x}$Al$_x$As, n-Ga$_{1-u}$Al$_u$As, n,p or undoped Ga$_{1-y}$Al$_y$As, p-Ga$_{1-z}$Al$_z$As and p-GaAs, where x, z>u>y. A selective proton implant is performed in contact layer 42 to form insulating regions 44 separated by a conductive rectangular region 48 through contact layer 42. Region 44 extends into cladding layer 40. A metallic contact may then be deposited on the surface of contact layer 42. A metalization 46 is formed on the bottom surface of substrate 32.

As shown in FIG. 5, the active layer 38 is of two-dimensional character, i.e., layer 38 extends to the edges of the structure while only the region 39 acts as an active lasing region during current pumping. This region 39 may, for example, be about 10 μm long and 4 μm wide due to the formation of region 48 surrounded by the resistive region 44. The length and width of laser 30 are each about 250 μm.

Upon forward biasing of laser 30, carrier recombination occurs in active region 39. The two dimension layer 36 has an index of refraction that is sufficiently close to that of active region 39 to function as a transparent or passive waveguide so that radiation induced in the active layer will couple into layer 36 via the formed couplers 38.1.

Laser 30 may have, for example, the molar fraction values of x and z=0.4, y=0.05 and u=0.05.

Laser 30 is very similar in structure to the injection laser shown in the Xerox Disclosure Journal, Volume 4, Number 5, page 637 (September/October 1979), mentioned in the background of the invention, the major difference being the smallness in geometric size of the active region 39 compared to the active region of the laser disclosed in the Journal.

Active layer 38 is formed briefly as follows. With a selected epitaxial growth procedure, layers 34, 36 and 38 (for its full extent) are consecutively grown on substrate 32. Then, using a removable mask, a selective etch is performed on the deposited active layer 38, the portion of layer 38 remaining and being that portion beneath the mask. By selecting the proper etchant, an etch back under the mask edges produces the tapered couples 38.1. With the mask removed, the selected growth procedure is again applied to deposit layers 40 and 42.

Figure 7:
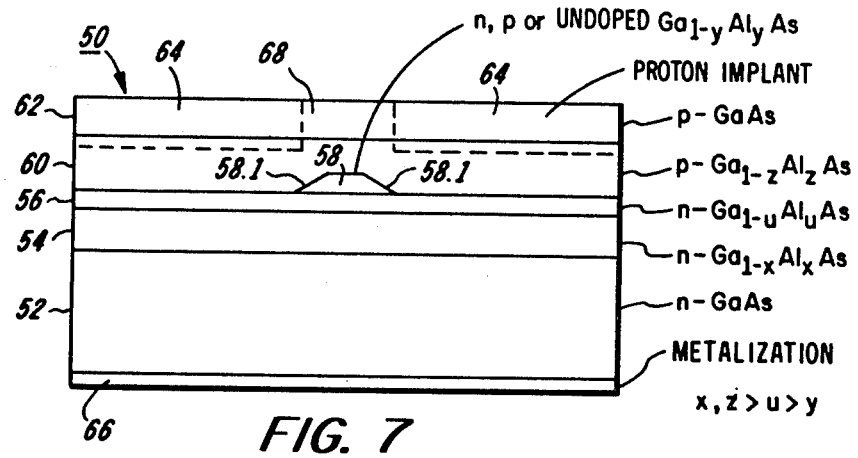
FIG. 7 is a side elevation of a heterostructure injection laser in accordance with still another embodiment of the present invention.
Figure 8:
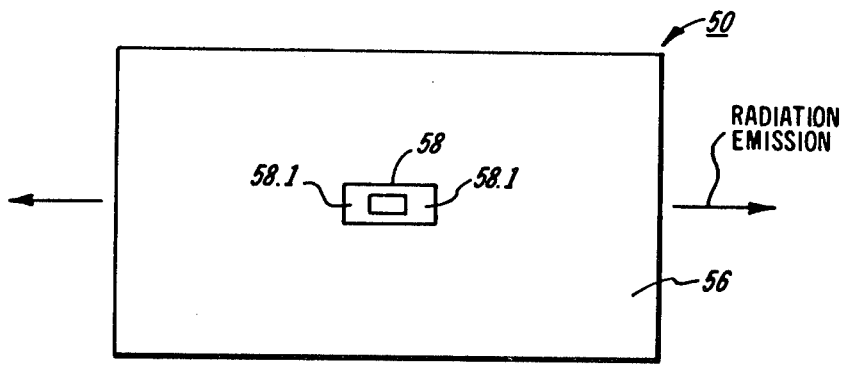
FIG. 8 is a top sectional view of the laser shown in FIG. 7, the section being taken at the plane of the active region of the laser.
Figure 9:
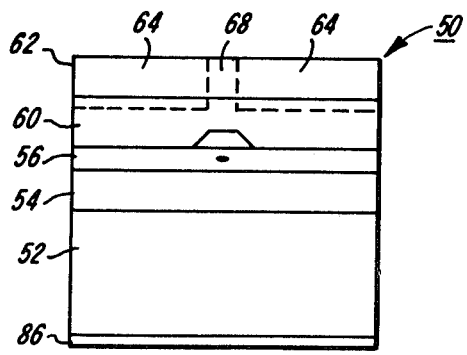
FIG. 9 is an end view of the laser shown in FIG. 7.

Injection laser 50 of FIGS. 7–9 comprises substrate 52 of n-GaAs and consecutively deposited cladding layer 54 of n-Ga$_{1-x}$Al$_x$As, passive waveguide layer 56 of n-Ga$_{1-u}$Al$_u$As, active region in the form of strip 58 of n,p or undoped Ga$_{1-y}$Al$_y$As, cladding layer 60 of p-Ga$_{1-z}$Al$_z$As and contact layer 62 of p-GaAs, where x, z>u>y. A proton implant 64 is performed on the surface of layer 62 leaving the conductive rectangular region 68 through layer 62. Region 64 extends into cladding layer 60. A metallic contact may then be deposited on the surface of layer 62. Another metallic contact 66 is deposited on the bottom surface of substrate 52.

As shown in FIG. 8, the active strip 58 is of three-dimensional character, i.e., strip 58 is an elongated mesa structure deposited on passive waveguide layer 56. Region 58 may, for example, be about 10 μm long and 4 μm wide. The tapered couplers 58.1 may be each additionally about 2.5 μm long. The length and width of laser 50 are each about 250 μm.

Upon forward biasing of laser 50, carrier and radiative recombination occurs in active strip 58. The two dimensional character, passive waveguide layer 56 has an index of refraction that is sufficiently close to that of active strip 58 to function as a transparent waveguide so that radiation produced in the active strip 58 will couple via couplers 58.1 into layer 56.

Figure 19:
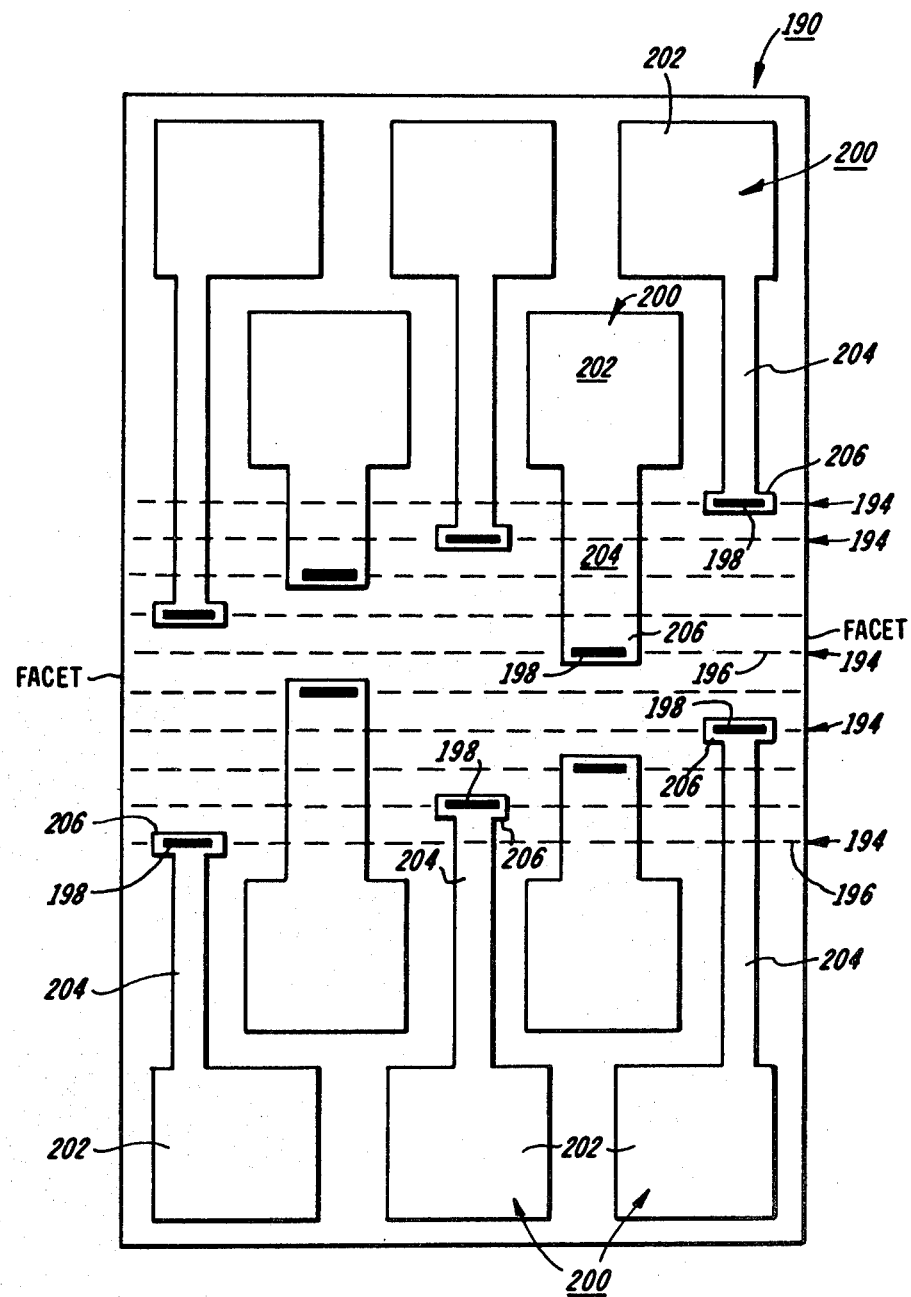

Molar fractions for x, y, u and z may be the same as exemplified for lasers 10 and 30. Active strip 58 is formed by applying the masking techniques taught in U.S. patent application Ser. No. 231,556 filed Feb. 4, 1981. An integral or removable mask may be employed. MO-CVD growth procedure is selected. After epitaxial growth has been accomplished to transparent layer 56, an aperture mask is applied to the surface of the structure as shown in FIGS. 4, 19 or 26 of the referenced patent application. Region 58 is then deposited through the mask aperture as taught in the referenced application. Afterwards, the mask is removed from the surface of the structure and the epitaxial growth is continued with the deposition of cladding and contact layers 60 and 62.

Figure 10:
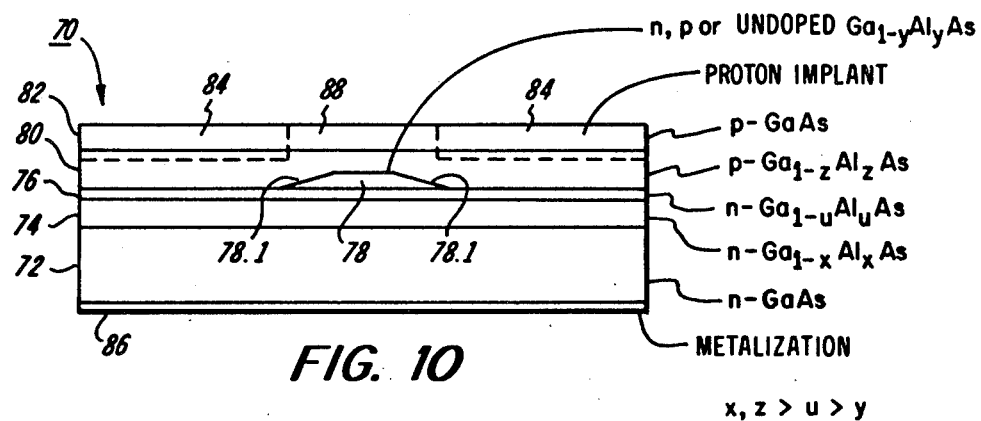
FIG. 10 is a side elevation of a heterostructure injection laser in accordance with further embodiment of the present invention.
Figure 11:
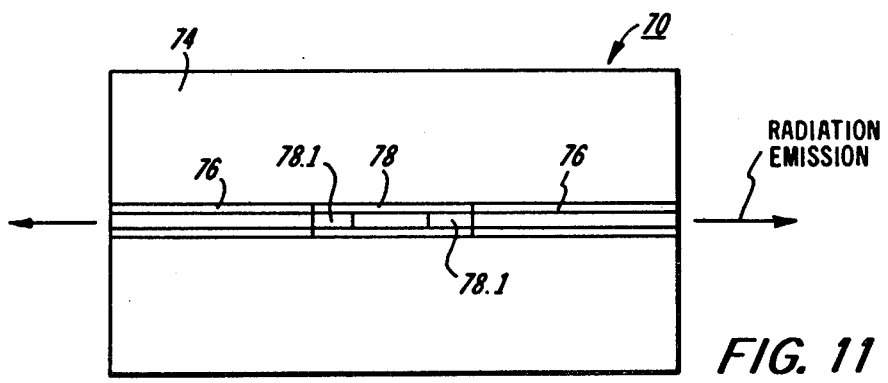
FIG. 11 is a top sectional view of the laser shown in FIG. 10, the section being taken at the plane of the active region of the laser.
Figure 12:
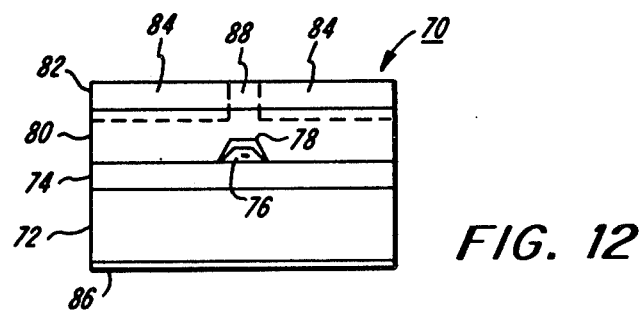
FIG. 12 is an end view of the laser shown in FIG. 10.

Injection laser 70 of FIGS. 10–12 comprises substrate 72 of n-GaAs and consecutively deposited cladding layer 74 of n-Ga$_{1-x}$Al$_x$As, transparent or passive waveguide strip 76 of n-Ga$_{1-u}$Al$_u$As, active region in the form of strip 78 of n, p or undoped Ga$_{1-y}$Al$_y$As, cladding layer 80 of p-Ga$_{1-z}$Al$_z$As and contact layer 82 of p-GaAs, where x, z>u>y. A proton implant 84 is performed on the surface of layer 82 forming the conductive rectangular region 88 through layer 82. Region 84 extends into cladding layer 80. A metallic contact may then be deposited on the surface of layer 82. Another metallic contact 86 is deposited on the bottom surface of substrate 72.

As shown in FIG. 11, the active strip 78 and the transparent strip 76 are both of three dimensional character, i.e., strip 78 is an elongated mesa structure deposited on a passive waveguide strip 76 that extends from one facet to the other of laser 70. Viewed from FIG. 12, active strip 78 is piggy back on passive strip 76. Strip 78 may be about 25 μm long and 4 μm wide. The tapered couplers 78.1 may be each additionally about 2.5 μm long. The length and width of laser 70 are each about 250 μm.

Upon forward biasing of laser 70, carrier and radiative recombination occurs in active strip 78. The three dimensional passive waveguide strip 76 has an index of refraction that is sufficiently close to function as a transparent waveguide strip so that radiation produced in the active strip 78 will couple via couplers 78.1 into the passive strip 76.

Molar fractions for x, y, u and z may be the same as exemplified for lasers 10 and 30.

Laser 70 is similar in design to the injection laser disclosed in FIG. 2 of U.S. Pat. No. 4,371,966, with one of the major differences being the smallness in geometric size of the active strip 78 compared to the active strip of the laser disclosed in the referenced application.

Laser 70 may be fabricated by the two stage growth process disclosed in U.S. Pat. No. 4,371,966. Alternatively, laser 70 may be fabricated by employing the masking techniques disclosed in U.S. patent application Ser. No. 231,556 filed Feb. 4, 1981.

First, layers 74 and 76 are epitaxially deposited upon substrate 72. Next, a strip mask is formed on layer 74 from end to end of substrate 72. Then a selective etch is made to remove all of layer 76 except for that portion beneath the mask. With removal of the mask, growth procedure is continued with the initial application of an apertured mask centered over the central region of strip 76. The aperture in the mask is rectangular in shape and is spaced from the surface of strip 76 in a manner similar to that as illustrated in U.S. patent application Ser. No. 231,556 in FIGS. 28 and 29. After growth of strip 78, the mask is removed, and growth continues with the deposition of layers 80 and 82. The couplers 78.1 for active strip 78 are formed due to the spacing or chamber provided beneath the mask aperture as explained in U.S. patent application Ser. No. 231,556.

Figure 13:
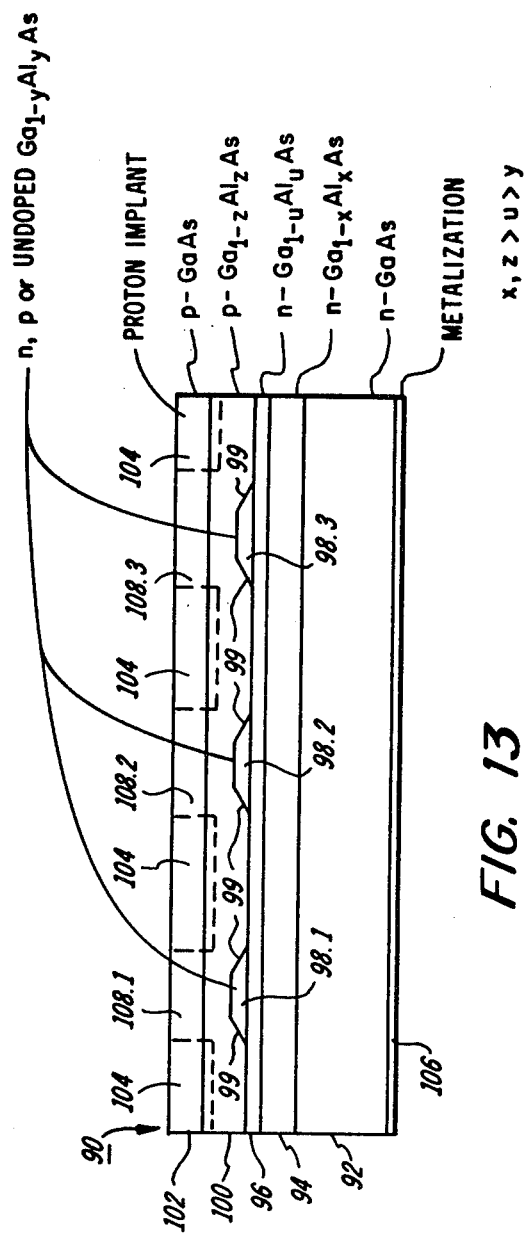
FIG. 13 is a side elevation of a heterostructure injection laser similar to the laser of FIG. 10 but having multiple short active regions.
Figure 14:
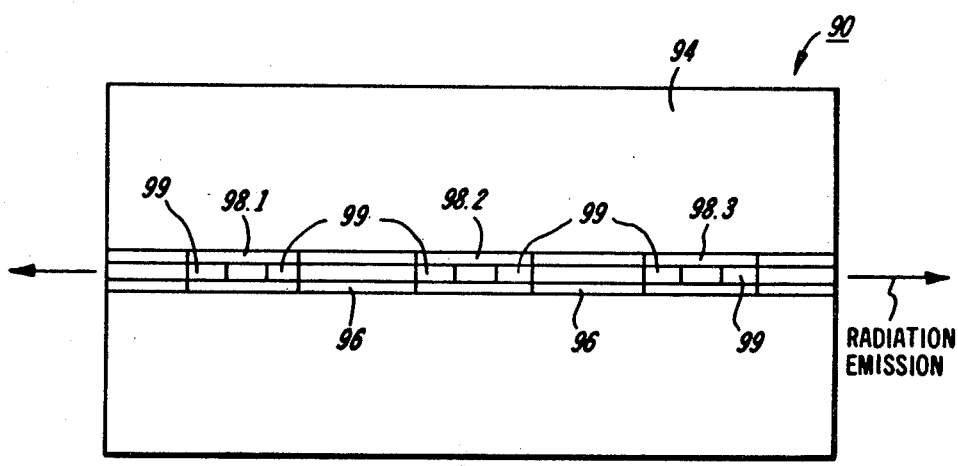
FIG. 14 is a top sectional view of the laser shown in FIG. 13, the section being taken at the plane of the active region of the laser.

Injection laser 90 of FIGS. 13 and 14 is the same as laser 70 except three active regions are present instead of a single active region.

Laser 90 comprises substrate 92 of n-GaAs, and consecutively deposited cladding layer 94 of n-$Ga_{1-x}Al_xAs$, passive waveguide strip 96 of n-$Ga_{1-u}Al_uAs$, active region in the form of strips 98.1, 98.2 and 98.3 of n,p or undoped $Ga_{1-y}Al_yAs$, cladding layer 100 of p-$Ga_{1-z}Al_zAs$ and contact layer 102 of p-GaAs, where x, z>u>y. A proton implant 104 is performed at the surface of layer 102 with selective formation of three conductive rectangular regions 108.1, 108.2 and 108.3 through contact layer 102. Regions 108 extends into cladding layer 100 and are substantially aligned over active strips 98. A metallic contact may then be deposited on the surface of layer 102. Another metallic contact 106 is deposited on the bottom surface of substrate 92.

The dimensional and compositional aspects for laser 90 are the same as those for laser 70. The length of each of the active strips may be about 10 μm while the length of passive strip 96 may be about 250 μm. Passive waveguide strip 96 extends from one end facet to the other. The three active strips 98 are positioned on the passive strip 96. The fabrication of laser 90 would be accomplished the same as in laser 70.

Upon forward biasing of laser 90, carrier and radiative recombination occurs in each of the active strips 98. Strip 76 has an index of refraction that is sufficiently close to that of the active strips 98 to function as a transparent waveguide so that radiation produced in the active strips 98 will couple via couplers 99 into the passive strip 96.

This multiple short active region concept may be also applied to the structures of lasers 10, 30 and 70.

Figure 15:
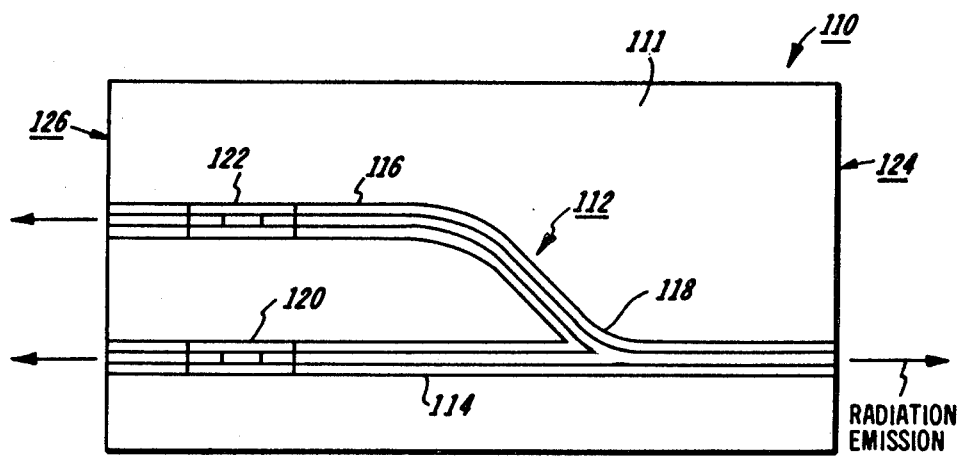
FIG. 15 is a top sectional view of a heterostructure injection laser similar to the laser of FIG. 10 but having multiple short active regions coupled to independent passive waveguide strips, which passive strips are also coupled together.

In FIG. 15, the laser 110 is of the same type of layer/strip structural design as lasers 70 and 90 except that passive waveguide geometry 112 disposed on a cladding layer 111 comprises a main passive strip 114 coupled at 118 to an offset passive strip 116. Strips 114 and 116 respectively have an active region strip 120 and 122. The radiation emission of this structure provides a single emitter at facet 124 and dual emitter at facet 126.

Employing short active regions introduces the practicality of fabricating laser arrays on a single chip having acceptable heat sink characteristics due to lower operating currents. Since the active regions are much shorter than the length of the laser optical cavity the active regions may easily be accessed by independent bonding pads formed on an ion implanted or diffused surface of the laser array chip. FIGS. 16–19 illustrate different possible bonding pad arrangements.

Because of the simple multiple arrangements of bonding pads possible, easy electrical connection can be made directly to the bonding pads. Operation of each laser may be accomplished at lower pumping currents due to smaller active regions and lower thresholds. For example, with ten conventional lasers in a conventional array, the length of the contact bonding pads would be substantially the length of the optical cavity of each laser. Each laser in the array would require a current feed of up to about 100 mA because of long contact pads and long active regions. This amounts to a requirement of almost one amp of current to operate the entire laser array. Experience has shown that it is very difficult to heat sink a laser array device that takes one amp of current. This would require p-side bonding to the heat sink which creates difficulty in isolating the several contacts.

By using pad arrangements and short active regions disclosed in FIGS. 16–19, it is possible to bond the laser array n-side down thereby permitting each laser in the array to be separately adressed from the p-side directly to the short active regions via the current confinement regions thereabove, i.e., region 28 of laser 10; region 48 of laser 30; region 68 of laser 50 or region 88 of laser 70. As a result, lower currents such as, 20–30 mA per laser, are necessary rather than higher pumping currents previously alluded to.

The bonding pads may be evaporated on the surface of the laser array with the use of a mask. The mask consists of a plurality of apertures comprising the outline of each bonding pad. Each bonding pad comprises a large lead connection pad, a contact pad aligned with the current input region of each array laser and possibly a connection strip between each pair of connection and contact pads. Due to the employment of small active regions requiring smaller current confinement regions, more real estate is available on a single multiple laser chip for bonding pad connection to each laser in the array without electrically interfering with the operation of adjacent laser cavities in the array. In other words, the lasers in the array can be more closely spaced (higher packing density) and each laser cavity can each be independently supplied with pumping current via contact pads that cross over the optical waveguides of other lasers in the array without causing any distrubance in their operation. Also, laser logic and driving circuits may be fabricated directly on the same chip.

In the bonding pad arrangements shown in FIGS. 16–19, the laser array chip may be about 750 $\mu$m long, with each active region being about 25 $\mu$m long. The separation between lasers in the array may be about 100 $\mu$m, which separation conventionally has been around 500 $\mu$m.

Figure 16:
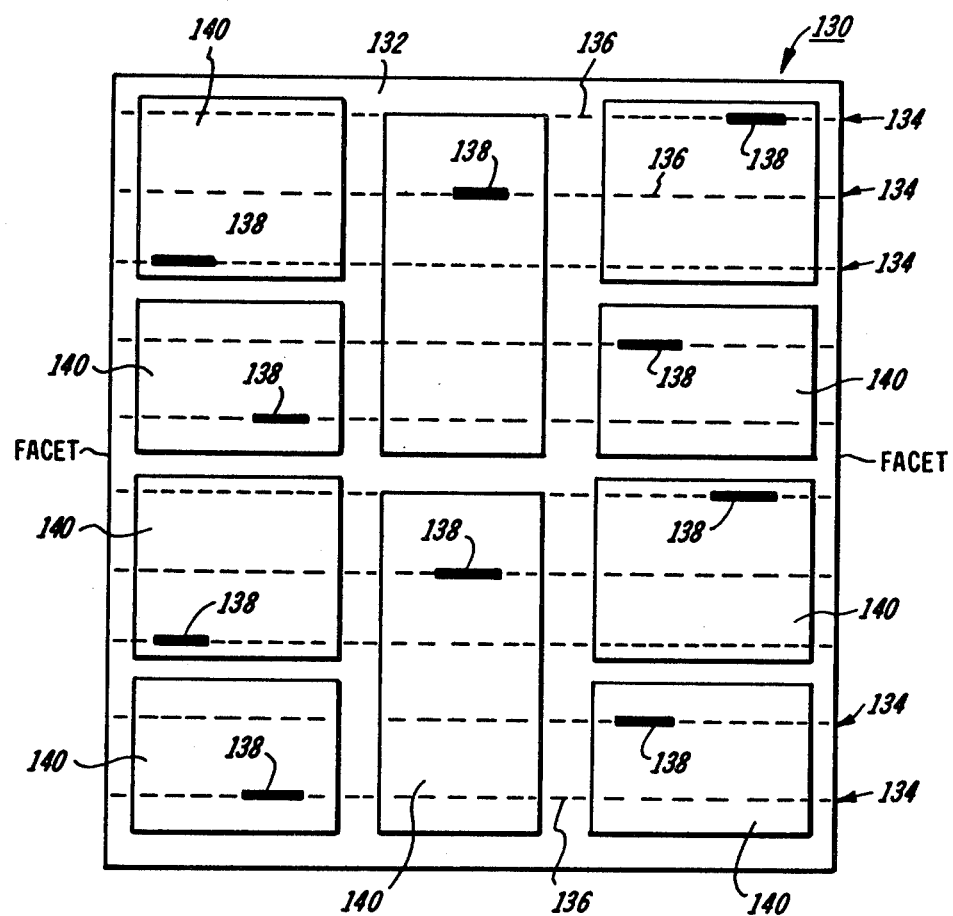
FIG. 16–19 are various top views of laser chips having arrays of heterostructure injection lasers possible due to the employment of short active regions of the types illustrated in FIGS. 1–15.

In FIG. 16, a plan view is shown of a laser array chip 130. The top surface 132 is insulating except for the regions 138. Ten lasers 134 are shown in the array, each laser having an optical cavity 136 and a vertically aligned active region and current confinement conductive region 138. Bonding pads 140 are each positioned to be in contact with a single region 138. Pads 140 are large enough to accommodate electrical lead connection.

Figure 17:
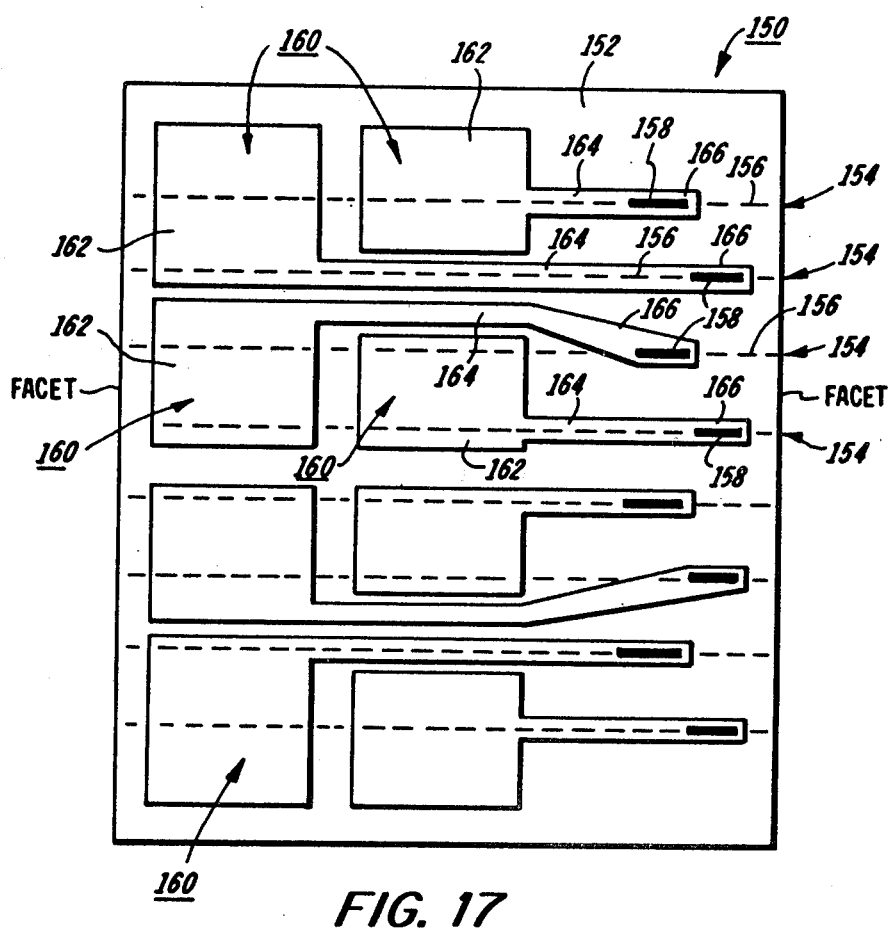

In FIG. 17, a plan view is shown of another laser array chip 150. The top surface 152 is insulating. Eight lasers 154 are shown in the array, each laser having an optical cavity 156 and a vertically aligned active region and current confinement conductive region 158. Bonding pads 160 include lead connection pads 162 and contact pads 166 over each region 158 with a connection strip 164 connecting combination connection pads 162 and contact pads 166. Connection pads 162 are formed in aligned rows along one side of the chip 150 for easy lead connection.

Figure 18:
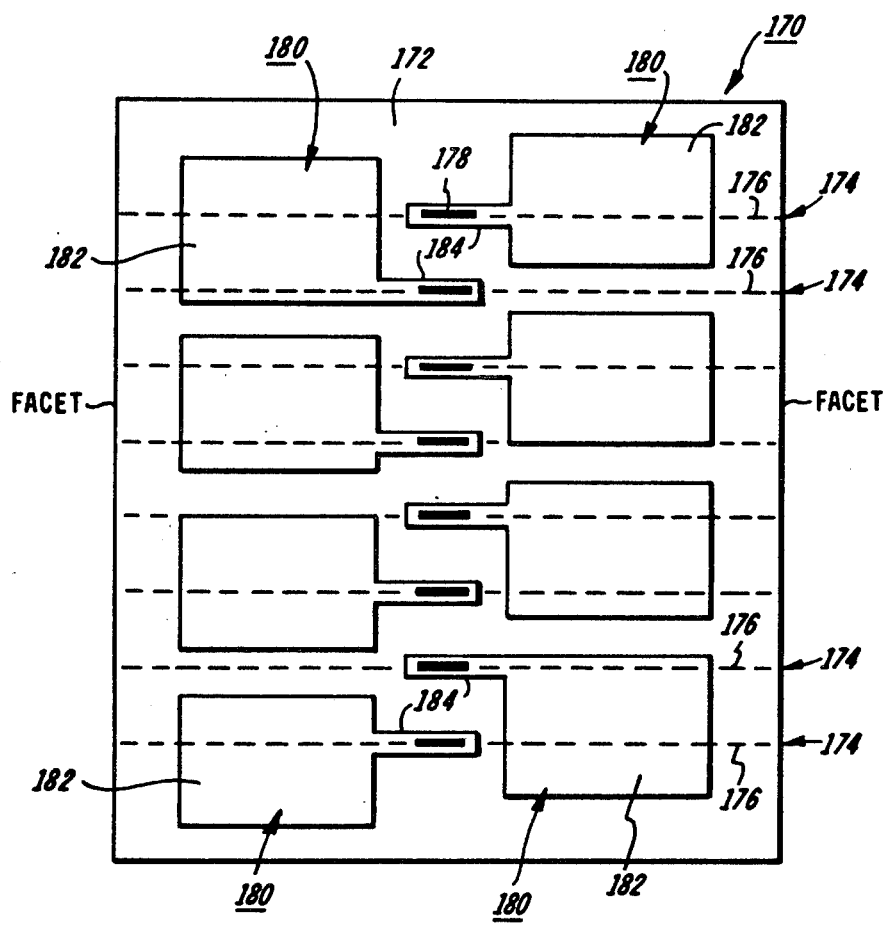

In FIG. 18, a plan view is shown of a laser array chip 170. On top insulating surface 172 are a plurality of bonding pads 180, one pad for each of the eight lasers 174 making up the array. Each laser 174 has an optical cavity 176 and aligned active region and current confinement region 178. Each bonding pad 180 comprises a lead connection pad 182 connected to a contact pad 184 aligned over each region 178. Connection pads 182 are aligned in separate rows along opposite edges of the chip for each lead connection.

In FIG. 19, a plan view is shown of another laser array chip 190. The lasers 194 are ten in number and are centrally located in chip 190. Each laser 194 has an optical cavity 196 and a vertically aligned active region and current confinement conductive region 198. Bonding pads 200 are formed on insulating surface 192 and consist of a connection pad 202 and a contact pad 206 connected by a strip 204. The arrangement of FIG. 19 conveniently places the connection pads away from the laser array into parallel rows on opposite edges of the chip for easy side lead connection.

FIGS. 20–24 illustrate applications of laser arrays made possible by the employment of short active regions for each injection laser.

Figure 20:
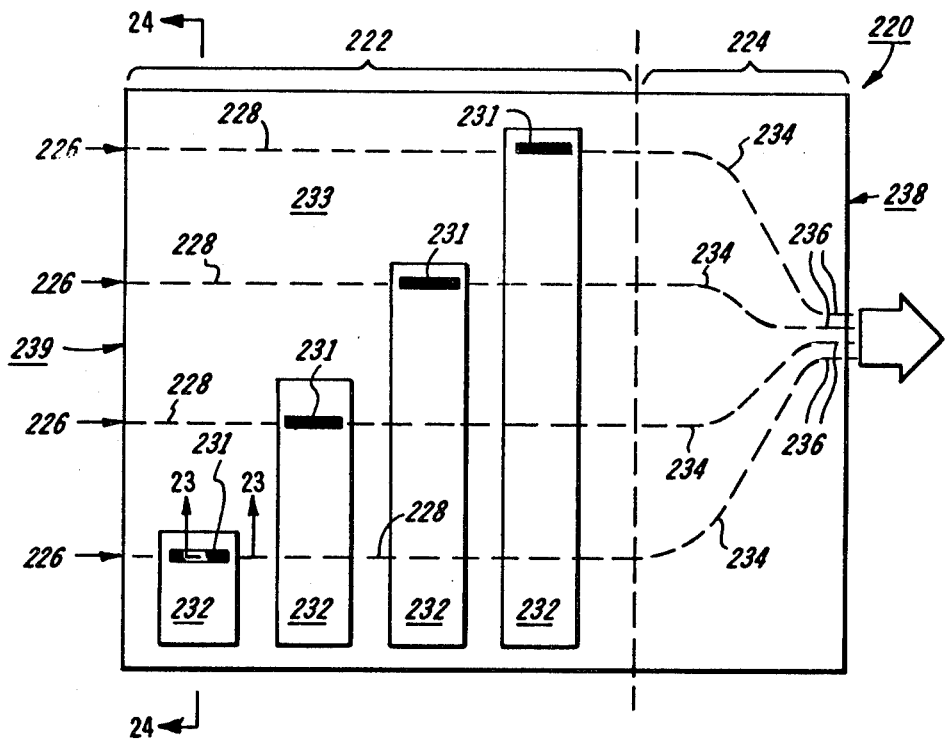
FIG. 20 is a top view illustration of a laser array with a plurality of closely spaced emitters useful in optical disk recording systems.

In FIGS. 20 and 21, a laser array chip 220 comprises two principal regions, an individually addressable laser source region 222 and a curved passive waveguide region 224. Region 222 comprises four laser sources 226 including optical cavities 228 and vertically aligned active regions 230 and current confinement conductive regions 231. Bonding pads 232 are deposited on the electrically insulating surface 231 and permit independent electrical addressing of each of the four laser sources 226.

The passive waveguide region 224 comprises four low loss passive curved waveguide strips 234. As best illustrated in FIG. 21, radiation generated in the active regions 230 is coupled into the passive waveguide strips 228 and along the curve strips 234 to the output facet 238. Because no radiation is being generated in region 224, the forward ends 236 of strips 234 can be spaced very close at the point of emission at output facet 238. For example, the spacing between strip ends 236 may be 5 $\mu$m or less. Facet 239 may be provided with a high reflecting surface.

The spacing between emitters at output facet 238 is an important factor in optical disk recording systems employing diode or injection laser arrays. Conventionally, the spacing between lasers in an array are about 500 $\mu$m.

There are two restrictions governing this spacing when utilizing conventional geometries. First, the laser sources must be individually addressed for multiple channel writing in an optical disk recording system. This requires individual electrical contacts for each laser for the full length of the conventional active region of each laser source to be pumped. This requires larger currents with accompanying greater heat generation.

Second, the laser sources must be physically separated by at least 100 $\mu$m so that adequate heat dissipation can be successfully provided for continuous operation of the laser sources. With these restraints present, it is very difficult, if not impossible, to provide a laser array with close emitting spots.

The problem in optical disk recording systems with laser sources having a 100 $\mu$m separation or more is that it is impractical to collect the radiation efficiently into a single lens and, thus, higher optical power levels are necessary. Laser array chip 220 permits the use of laser array sources that can be individually addressed and provide an emitting region at strip ends 236 where radiation emission at facet 238 is spaced 5 $\mu$m or less making it practical to collect radiation efficiently from all laser sources into a single lens.

Figure 22:
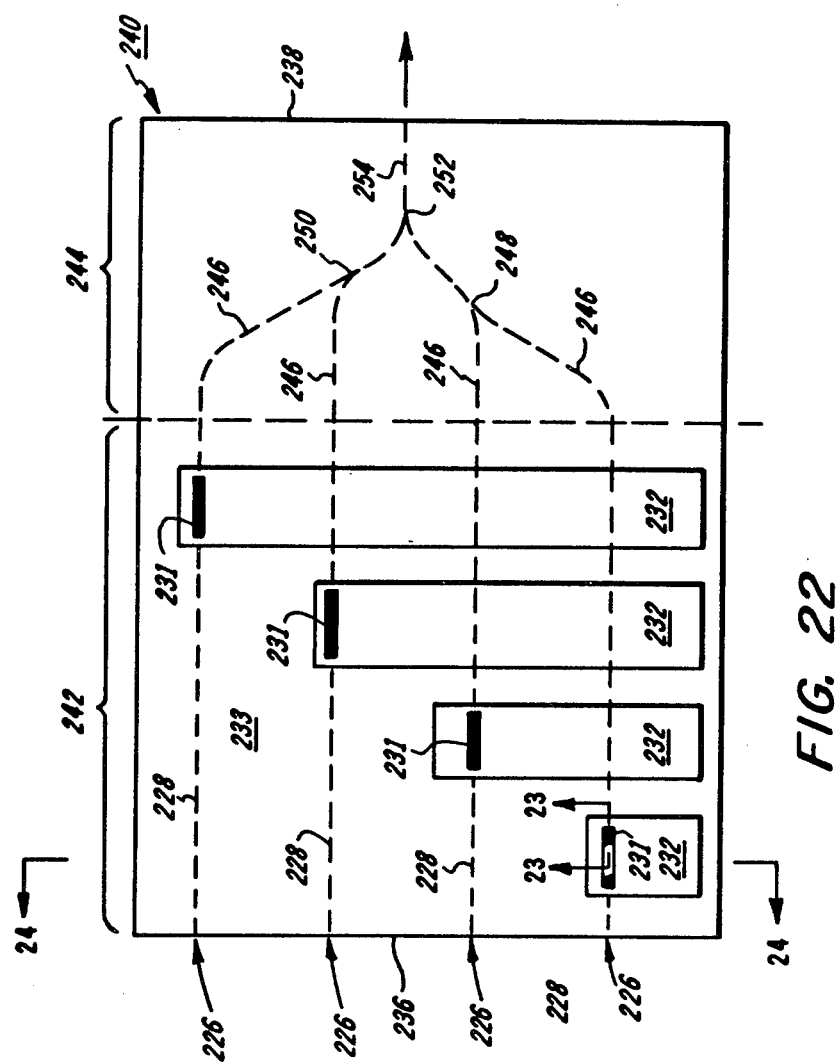
FIG. 22 is a top view illustration of a laser array with a single emitter.

The laser array chip 240 in FIG. 22 comprises two principal regions, an individually addressable laser source region 242 (which is identical to region 222 in FIG. 20 and, therefore, identical numerical identification is shown) and a curved passive waveguide region 244. Region 244 comprises four low loss passive curved waveguide strips 246 that are coupled at 248, 250 and 252 to form a single emission cavity 254 at output facet 238. Laser array chip provides magnified power optical output from cavity 254, which is not available from a single laser source.

Figure 23:
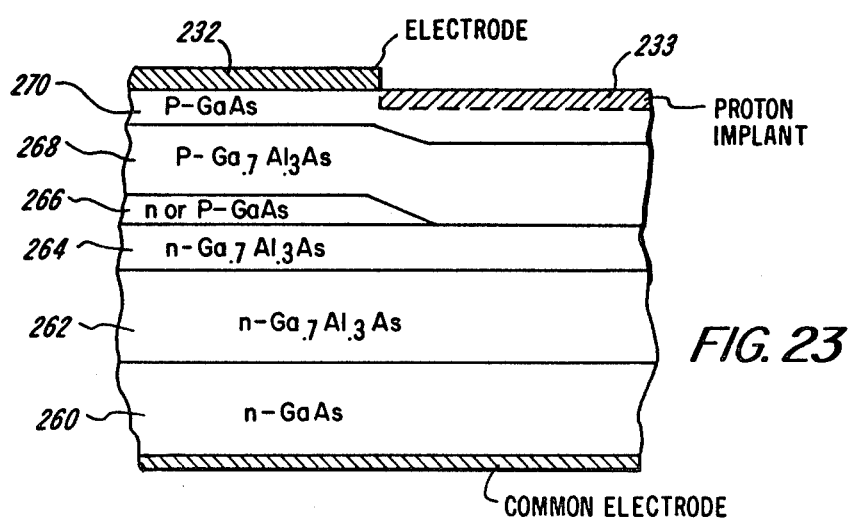
FIG. 23 is a side elevation of an implementation of a portion of the active region configuration taken along the line 23—23 of FIGS. 20 and 22.
Figure 24:
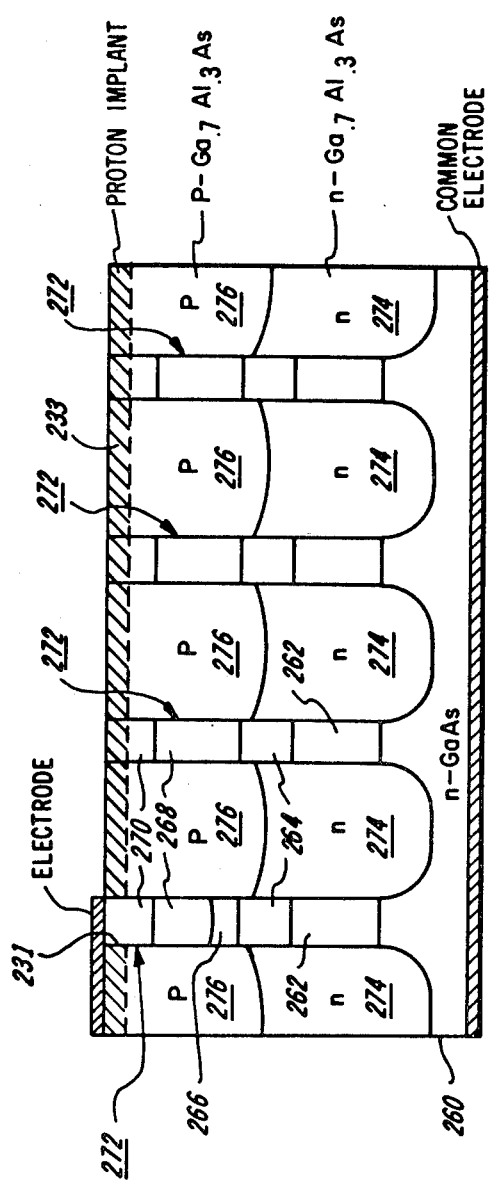
FIG. 24 is a sectional view taken along the line 24—24 of FIGS. 20 and 22.

FIGS. 23 and 24 illustrate an example of a buried heterostructure configuration for the chips 220 and 240. The structure comprises a substrate 260 of n-GaAs upon which is consecutively deposited a cladding layer 262 of n-Ga.$_7$Al.$_3$As, a passive waveguide layer 264, an active strip 266 of n or p-GaAs, a cladding layer 268 of p-Ga.$_7$Al.$_3$As and a contact layer 270 of p-GaAs. The formation of the active strips 266 is done in the manner previously explained relative to the fabrication of laser 70 of FIGS. 10–12.

After deposition of these layers, a preferential etch into substrate 260 is performed, as best illustrated in FIG. 24. This preferential etch forms four mesa structures 272 from facet to facet in accordance with the mask configuration for the desired optical cavity/passive waveguide strip geometry. A second stage epitaxial growth, with the top surfaces of the mesa structures masked, is then commenced with the deposition of the isolation layer 274 (Zn doped Ga.7Al.3As) followed by the deposition of the cover layer 276 (Ge doped Ga.7Al.3As). Current confinement regions 231 for the active strips 266 is provided by the proton implant region 233, as previously explained relative to lasers 20, 30, 50 and 70.

While the invention has been described in conjunction with specific embodiments, it is evident that many alternatives, modifications and variations will be apparent to those skilled in the art in light of the foregoing description. For example, other injection laser material systems such as, the GaAlAsP quaternaries, may be employed. Accordingly, it is intended to embrace all such alternatives, modifications, and variations as fall within the spirit and scope of the appended claims.

What is claimed is:

1. In an injection laser comprising a plurality of contiguous semiconductor layers deposited on a substrate, one of said layers being an active layer and having a lower bandgap and higher index of refraction relative to at least cladding layers immediately adjacent to said active layer, said active layer having an active region to permit carrier recombination and support radiation propagating under lasing conditions in an optical cavity established between transverse end facets of the laser, means incorporated into said laser to confine current to said active region, the extremities of said active region falling short of said end facets so that the regions between the ends of Serial No. 338,455 said active region and said end facets function as a passive waveguide for the propagating radiation and form part of said optical cavity characterized in that said active region comprises an active region strip having a length less than the total length of both of said passive waveguide regions formed at the ends of said active region strip.

2. In the injection laser of claim 1 wherein said strip is integral with a passive waveguide layer functioning as said passive waveguide and capable of confining propagating radiation in at least one dimension transverse to the direction of propagation.

3. In the injection laser of claim 1 wherein said strip is integral with a passive waveguide strip functioning as said passive waveguide and capable of confining propagating radiation in both dimensions transverse to the direction of propagation.

4. In the injection laser of any one of the claims 1 through 3 wherein said active region strip length is in the range of 5 to 200 times shorter than said cavity length.

5. In the injection laser of any one of the claims 1 through 3 wherein said active region strip is in the range of 1 to 50 µm in length and 1 to 20 µm in width.

6. In the injection laser of claim 3 wherein said passive waveguide comprises a strip between said end facets, said active region strip integral with said passive waveguide strip at one point along its length which appears to couple radiation produced in said active region into said passive waveguide strip.

7. In the injection laser of claim 5 wherein there is more than one active region strip integral with said passive waveguide strip.

8. In the injection laser of claim 6 wherein there are two or more lasers forming a laser array including at least two passive waveguide strips and at least one active region strip integral with each of said passive waveguide strips and each with means to couple radiation produced in each of said active regions into its corresponding integral passive waveguide strip.

9. In the injection laser of claim 8 wherein each of said passive waveguide strips are optically coupled to at least one other of said passive waveguide strips.

10. In the injection laser of claim 8 wherein the points of emission of radiation from said passive waveguide strips is characterized by having a spacing of 5 µm or less.

11. The injection laser of claim 8 wherein all of said passive waveguide strips are optically coupled together to provide a single point of emission of radiation from said laser.

12. The injection laser of claim 8 wherein there is current confinement means for each of said active region strips at corresponding regions on the surface of said laser array and bonding pads each comprising lead connection pad coupled to contact connection pad on the surface of said laser array, each of said connection pads in electrical contact with a corresponding current confinement surface region, said lead connection pads being aligned in one or more rows for lead connection thereto.

13. In an injection laser array device comprising a plurality of contiguous semiconductor layers deposited on a substrate, one of said layers being an active layer and having a lower bandgap and higher index of refraction relative to at least cladding layers immediately adjacent to said active layer, said active layer defining a plurality of active regions for each laser in the array to permit carrier recombination and support radiation propagating under lasing conditions in an optical cavity established for each array laser between transverse end facets of the laser, means formed on and into the surface of said device to form separate current confinement regions to each of said active regions, the extremities of said active regions falling short of said end facets so that the regions between the ends of said active regions of each laser cavity and said end facets function as a passive waveguide for the propagating radiation established in each of said optical cavities, said laser array device characterized in that each of said active regions comprises an active region strip having a length less than the total length of both of said passive waveguide regions formed at the ends of each of said active region strips, means formed on the surface of said device to render the surface thereof electrically insulating except for said current confinement regions, electrical contact means formed on said insulating surface means to independently supply current to each of said current confinement regions thereby permitting the optical cavities of adjacent laser cavities in the array to be fabricated spatially closer to one another while permitting independent electrical addressing of each of said laser active regions without interfering with the electrical and optical operation of the other said array lasers.

14. In the injection laser array device of claim 13 wherein the active regions of adjacent array lasers are offset relative to each other so that the packing density of the lasers in the array may be increased.

* * * * *

UNITED STATES PATENT AND TRADEMARK OFFICE
CERTIFICATE OF CORRECTION

PATENT NO. : 4,461,007
DATED : July 17, 1984
INVENTOR(S) : Robert D. Burnham et al It is certified that error appears in the above-identified patent and that said Letters Patent are hereby corrected as shown below:

Column 11, line 37, delete the words "Serial No. 338,455".

Signed and Sealed this

Fifteenth Day of January 1985

[SEAL]

Attest:

*Attesting Officer*

GERALD J. MOSSINGHOFF

*Commissioner of Patents and Trademarks*